United States Patent [19]
Carmi

[11] Patent Number: 5,705,966
[45] Date of Patent: Jan. 6, 1998

[54] LC-TYPE DIELECTRIC STRIP LINE RESONATOR

[75] Inventor: Moshe Carmi, Givat Shmuel, Israel

[73] Assignee: I.T.-Tel Ltd., Petach Tikva, Israel

[21] Appl. No.: 691,790

[22] Filed: Aug. 2, 1996

[51] Int. Cl.$^6$ ........................................... H03H 7/00
[52] U.S. Cl. ........................... 333/219; 333/202; 333/185
[58] Field of Search .................... 333/185, 202, 333/204, 219

[56] References Cited

U.S. PATENT DOCUMENTS

| | | | |
|---|---|---|---|
| 3,566,315 | 2/1971 | Vinding | 333/219 |
| 4,551,696 | 11/1985 | Moutrie et al. | 333/219 |
| 4,706,050 | 11/1987 | Andrews | 333/219 |
| 4,888,568 | 12/1989 | Kawaguchi | 333/185 |
| 5,126,707 | 6/1992 | Ikeda | 333/185 |
| 5,404,118 | 4/1995 | Okamura et al. | 333/185 |
| 5,530,411 | 6/1996 | Nakata et al. | 333/219 |

FOREIGN PATENT DOCUMENTS

| | | | |
|---|---|---|---|
| 5-218705 | 8/1993 | Japan | 333/204 |
| 5-335866 | 12/1993 | Japan | 333/185 |
| 6-97705 | 4/1994 | Japan | 333/204 |

*Primary Examiner*—Benny Lee
*Assistant Examiner*—Darius Gambino
*Attorney, Agent, or Firm*—Lowe, Price, LeBlanc & Becker

[57] ABSTRACT

A novel LC-type network consisting of distributed inductors and capacitors realized by means of printed patterns on a printed circuit board is disclosed. The LC-type network is based on a dielectric strip line two terminal resonance circuit consisting of a capacitance and inductance in parallel which forms a high Q resonator suitable for application in the construction of high frequency filters and oscillators. Constructing the resonator on a printed circuit board provides for high accuracy and repeatability. In addition, the need for trimming and/or tuning is eliminated thus lowering production costs.

9 Claims, 3 Drawing Sheets

LC-TYPE DIELECTRIC STRIP LINE RESONATOR

FIELD OF THE INVENTION

The present invention relates generally to LC-type networks in general and more particularly relates to LC-type dielectric strip line networks for forming high quality (Q) resonators that have applications in high frequency filters and oscillators.

BACKGROUND OF THE INVENTION

High frequency radio frequency (RF) communications are becoming more and more prevalent in the world today. Products touting wireless RF communication links are becoming increasingly popular among consumers. A multitude of new products including redesigned existing ones are being built with wireless RF links today. Most RF communication circuits employ some form of resonant circuitry in their transmitters and receivers. Due to the explosive consumer demand for products sporting wireless communication links there is a need for a low cost, high accuracy and high reliability resonator suitable for mass manufacture using conventional techniques.

SUMMARY OF THE INVENTION

Accordingly, it is an object of the present invention to provide a printed circuit board based two terminal resonance circuit which is suitable for mass production having negligible variances in production thus eliminating the need for tuning or trimming and resulting in high accuracy and repeatability at low production cost.

It is another object of the present invention to provide a printed circuit board based two terminal resonance circuit whose center frequency is determined by the dimensions of the patterns used to form it.

The present invention discloses an LC-type network consisting of distributed inductors and capacitors realized by means of printed patterns on a printed circuit board. The LC-type network is based on a dielectric strip line two terminal resonant circuit consisting of a capacitance and inductance in parallel which forms a high Q resonator suitable for application in the construction of high frequency filters and oscillators. Constructing the resonator on a printed circuit board provides for high accuracy and repeatability. In addition, the need for trimming and/or tuning is eliminated thus lowering production costs.

There is thus provided in accordance with a preferred embodiment of the present invention an LC-type dielectric strip line resonator, comprising a dielectric material having a dielectric constant, an upper surface and a lower surface, a conductive rectangular strip line stub having a length $l_2$, a width, an input portion and a ground portion, the length of the stub greater than the width of the stub, the input portion for receiving an input signal from an external circuit, a first connecting strip line stub formed on the upper surface of the dielectric material, the first connecting stub coupled to one side of the input portion of the stub, the first connecting stub having a width approximately that of the stub, a second connecting strip line stub formed on the upper surface of the dielectric material, the second connecting stub coupled to the opposite side of the input portion of the stub, the second connecting stub having a width approximately that of the stub, a first conductive rectangular strip line wing formed on the upper surface of the dielectric material, the first rectangular wind having a length $l_1$ and a width, the first rectangular wing coupled to the first connecting stub, a second conductive rectangular strip line wing formed on the upper surface of the dielectric material, the second rectangular wing having a length $l_1$ and a width, the second rectangular wing coupled to the second connecting stub in symmetrical fashion with the first rectangular wing, and a conductive ground plane formed on the lower surface of the dielectric material, the ground plane having a length and width large enough to cover the rectangular stub, the first connecting stub, the second connecting stub, the first rectangular wing and the second rectangular wing, the ground portion of the rectangular stub comprising at least one through hole electrically coupling the rectangular stub to the ground plane.

Further, the length $l_1$ of the first and second rectangular wings can be equal to the length $l_2$ of the rectangular stub, the length $l_1$ of the first and second rectangular wings can be smaller than the length $l_2$ of the rectangular stub or the length $l_1$ of the first and second rectangular wings can be greater than the length $l_2$ of the rectangular stub.

There is also provided in accordance with a preferred embodiment of the present invention an LC-type dielectric strip line resonator, comprising a dielectric material having a dielectric constant, an upper surface and a lower surface, a conductive rectangular strip line stub having a length $l_2$, a width, an input portion and a ground portion, the length of the stub greater than the width of the stub, the input portion for receiving an input signal from an external circuit, a connecting strip line stub formed on the upper surface of the dielectric material, the connecting stub coupled to one side of the input portion of the stub, the connecting stub having a width approximately that of the stub, a conductive rectangular strip line wing formed on the upper surface of the dielectric material, the rectangular wind having a length $l_1$ and a width, the rectangular wing coupled to the first connecting stub, a conductive ground plane formed on the lower surface of the dielectric material, the ground plane having a length and width large enough to cover the rectangular stub, the connecting stub and the rectangular wing, the ground portion of the rectangular stub comprising at least one through hole electrically coupling the rectangular stub to the ground plane.

In addition, there is provided in accordance with a preferred embodiment of the present invention LC-type dielectric strip line resonator, comprising a dielectric material having a dielectric constant, an upper surface and a lower surface, a conductive rectangular strip line stub having a length l, a width, an input portion and a ground portion, the length of the stub greater than the width of the stub, the input portion for receiving an input signal from an external circuit, a first conductive radial strip line wing formed on the upper surface of the dielectric material, the first rectangular wing having a length radius Ra and forming an angle A, the first radial wing coupled to one side of the input portion of the rectangular stub, a second conductive strip line radial wing formed on the upper surface of the dielectric material, the second rectangular wing having a length radius Ra and forming an angle A, the second radial wing coupled to the opposite side of the input portion of the rectangular stub in symmetrical fashion with the first radial wing, a conductive ground plane formed on the lower surface of the dielectric material, the ground plane having a length and width large enough to cover the rectangular stub, the first radial wing and the second radial wing, the ground portion of the rectangular stub comprising at least one through hole electrically coupling the rectangular stub to the ground plane.

BRIEF DESCRIPTION OF THE DRAWINGS

The invention is herein described, by way of example only, with reference to the accompanying drawings, wherein.

DETAILED DESCRIPTION OF THE INVENTION

To better understand the principle of operation of the present invention a brief background of transmission line theory is presented below. In addition material is also presented on the well known theory of strip lines and resonance circuits.

The input impedance of a transmission line is given by $$Z_{in} = Z_c \tan h[(\alpha+j\beta)l]$$

where $Z_c$ is the characteristic impedance of the transmission line $l$ is the length of the transmission line $\alpha$ is the attenuation of the transmission line per unit length $\beta$ is the wave number and is given by $$\beta \equiv \frac{2\pi}{\lambda}$$

For a low loss transmission line, where $\alpha l \ll \beta l$, the input impedance is given by $$Z_{in} = Z_c \alpha l + j Z_c \tan (\beta l)$$

The input impedance of an open circuit transmission line is given by $$Z_{in} = \frac{Z_c}{\alpha l + j \tan(\beta l)}$$

Figure 1:
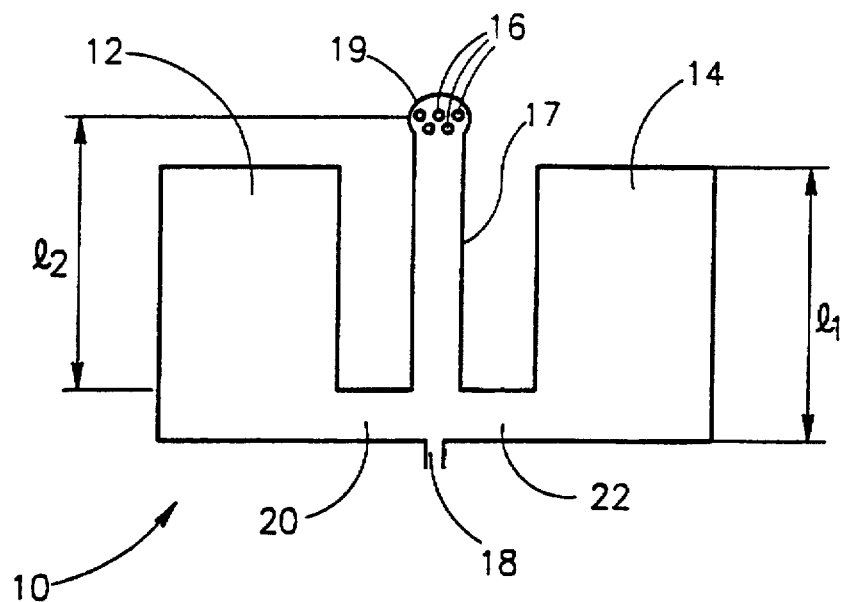
FIG. 1 is an upper view of a resonator constructed in accordance with a preferred embodiment of the present invention and having a short circuit line equal in length to the open circuit line.

An upper view of a resonator, generally designated 10, constructed in accordance with a preferred embodiment of the present invention is shown in FIG. 1. The resonator is a second order LC-type dielectric strip line two terminal resonance circuit. The resonator circuit 10 comprises a capacitance and inductance in parallel. It can be constructed on a printed circuit board (PCB) such as common FR4 glass epoxy or any other suitable PCB material having suitable dielectric properties.

The resonator circuit 10 comprises a rectangular stub 17 whose length $l_2$ is greater than its width. One end of the stub, the input portion 18, functions to receive an input signal from a circuit coupled to the resonator. The other end of the stub, the grounded portion 19, is coupled to a ground plane (not shown) by way of at least one ground via or through hole 16. The at least one via to the ground plane must be of low impedance and inductance. Preferably at least four vias couple the ground portion of the stub with the ground plane with five shown in the examples presented throughout the Figures. A sufficient number of ground vias must be used so that the vias do not add significant impedance or inductance to stub 17. Two connecting stubs 20, 22 are coupled to the input portion of stub 17. Coupled to each connecting stub 20, 22 is a rectangular wing 12, 14, respectively, having a length $l_1$.

Stub 17 functions as a strip line inductor at high frequencies and wings 12, 14 function as one of the two plates forming a capacitor. The second plate of the capacitor is the ground plane which is deposited on the bottom surface of the PCB the circuit is constructed on. The ground plane must be large enough in area to cover at least the area of the wings and the stub on the top surface.

The center frequency of the resonator is determined by the dimensions of the patterns forming it on the PCB and by the dielectric constant of the PCB material. These dimensions are well defined and, using conventional PCB manufacturing techniques, have negligible variations during manufacture. Thus, high accuracy and repeatability can be achieved with low production costs and the elimination of the need for any tuning or trimming of the circuit.

Figure 2:
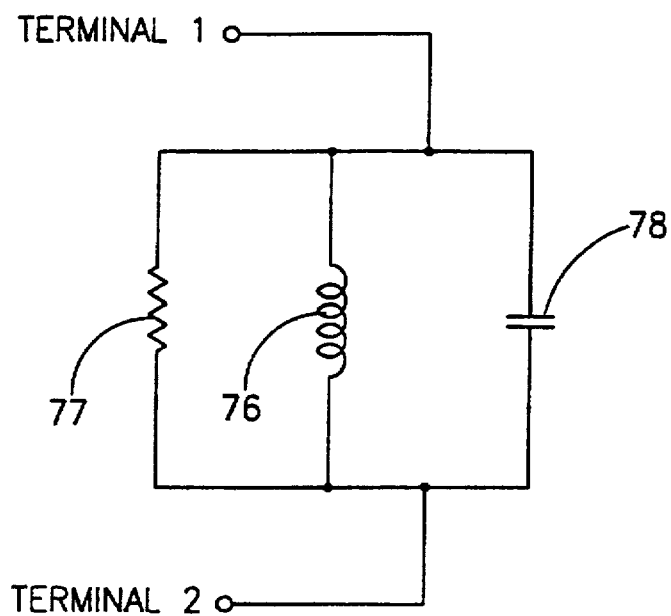
FIG. 2 is an equivalent schematic circuit drawing of the resonator of the present invention.

An equivalent schematic circuit drawing representing a model of the resonator of the present invention is shown in FIG. 2. The equivalent circuit models the resonator as a parallel combination of an ideal capacitor 78, an ideal inductor 76 and an ohmic resistance 77. Terminal 1 and 2 are the coupling points to the rest of the circuit. Due to the symmetry of the circuit terminal 1 and 2 are interchangeable. One of the two terminals corresponds to the input portion 18 of stub 17 and the other terminal corresponds to the ground portion 19 of stub 17. Stub 17 forms the inductance 76 and the two wings 12, 14 form the capacitance 78. The equivalent resistance 77 models the inevitable losses that result in a finite quality factor Q. The relationship between ohmic resistance and quality factor Q of a resonant circuit at resonance is given by $$Q = \frac{1}{R}\sqrt{\frac{L}{C}}$$

Figure 3:
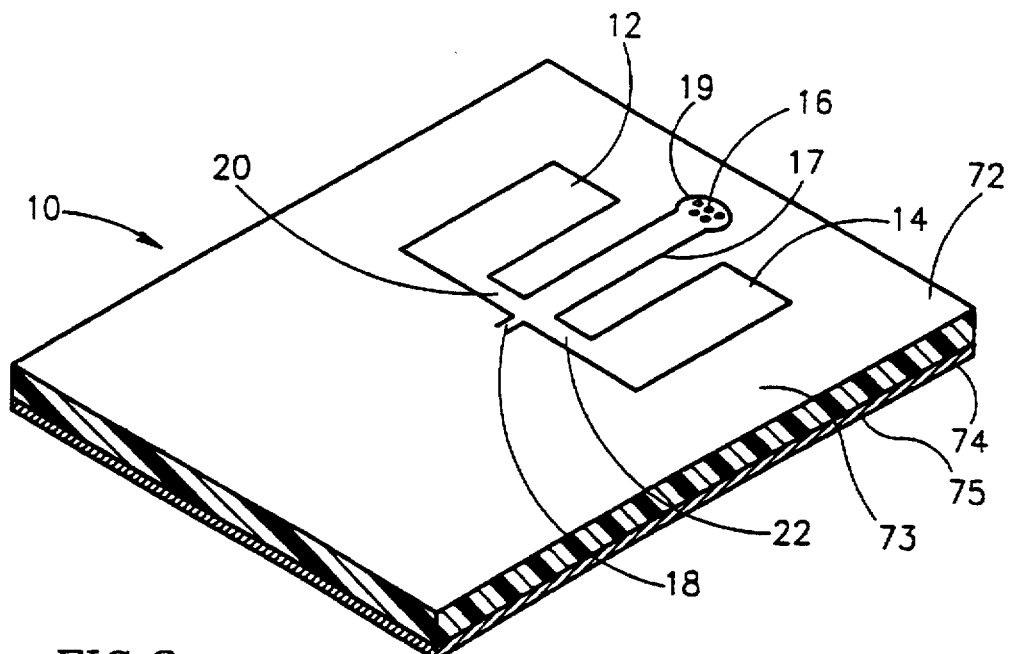
FIG. 3 illustrates a perspective view of the resonator shown in FIG. 1.

Illustrated in FIG. 3 is a perspective view of the resonator 10 that is shown in FIG. 1. The circuit is built on a PCB 72 having a top surface 73 and a bottom surface 75 and constructed to have particular dielectric properties. The circuit patterns are etched onto the top surface and the bottom surface comprises the ground plane 74. Preferably 1 oz./square foot type copper is used for constructing the circuit patterns and the ground plane. The PCB preferably has a thickness of approximately 1.6 mm. Other types and thicknesses are also suitable resulting in different system characteristics and performance.

The stub 17 of the resonator is a short circuit high impedance strip line that is coupled in parallel to two open circuit low impedance strip lines. The input admittance of the resonator 10 can be expressed as $$Y_{in} = \frac{2}{Z_{CL}}(\alpha l_1 + j \tan \beta l_1) + \frac{1}{Z_{CH}(\alpha l_2 + j \tan \beta l_2)}$$

where $Z_{CL}$ is the characteristic impedance of the open circuit transmission line $Z_{CH}$ is the characteristic impedance of the short circuit transmission line $l_1$ is the length of the open circuit line $l_2$ is the length of the short circuit line For a low loss transmission line, where $\alpha l \ll \beta l$, the input admittance is given by $$Y_{in} = \frac{2\alpha l_1}{Z_{CL}} + \frac{1}{Z_{CL}\alpha l_2} + j\left(\frac{2\tan\beta l_1}{Z_{CL}} - \frac{1}{Z_{CL}\tan\beta l_2}\right)$$

The resonance condition is given by $$\frac{2\tan\beta l_1}{Z_{CL}} = \frac{1}{Z_{CH}\tan\beta l_2}$$

For $l_1 = l_2 = l$ we obtain $$\tan\beta l = \sqrt{\frac{Z_{CL}}{2Z_{CH}}}$$

with the length $l$ given by $$l = \frac{1}{\beta}\tan^{-1}\sqrt{\frac{Z_{CL}}{2Z_{CH}}}$$

As stated previously, the resonator 10 can be modeled as an equivalent parallel resonant circuit as shown in FIG. 2. The expressions for the equivalent resistance, capacitance and inductance are presented below. The equivalent resistance R can be expressed as $$R = \frac{Z_{CL}Z_{CH}\alpha l}{2\alpha^2 l^2 Z_{CH} + Z_{CL}}$$

The equivalent capacitance C is given by $$C = \frac{2\tan\beta l}{Z_{CL}}$$

and the equivalent inductance L can be expressed as $$i\ L = Z_{CH}\tan\beta l$$

The quality factor Q is given by the ratio $$Q = \frac{R}{\omega L} = \frac{1}{\omega Z_{CH}\tan\beta l} \cdot \frac{Z_{CH}Z_{CL}\alpha l}{2\alpha^2 l^2 Z_{CH} + Z_{CL}}$$

At resonance $$\tan\beta l = \sqrt{\frac{Z_{CL}}{2Z_{CH}}}$$

and the quality factor Q may be expressed as $$Q = \frac{1}{\omega}\sqrt{\frac{2Z_{CH}}{Z_{CL}}} \cdot \frac{1}{2\alpha l\frac{Z_{CH}}{Z_{CL}} + \frac{1}{\alpha l}}$$

In practice, the quality factor Q of the resonator of the present invention may be on the order of 100.

Filters, oscillators or microwave circuits in general using the resonator of the present invention have several advantages over equivalent circuits that are based on transmission line resonance elements or discrete components. The dimensions of the resonator are more compact than transmission line resonant circuits which is important when the circuit is to function in equipment designed to be portable. A higher quality factor Q can more easily be obtained by properly selecting the parameters of the resonator (e.g., physical dimensions and PCB material). In addition, because the resonator is constructed using well known PCB strip line technology, high accuracy and repeatability are easily obtained thus eliminating the need for a tuning or trimming step during manufacture making the resonator very suitable for mass production. Also, manufacturing costs are greatly reduced due to the use of strip line technology, eliminating the need for discrete components and their associated high assembly cost.

In addition to FIG. 1, FIGS. 4 through 7 illustrate additional examples of realizations of the resonator of the present invention. An upper view of the resonator 10, discussed previously, is shown in FIG. 1. In this embodiment, the short circuit line $l_2$ and the open circuit line $l_1$ are equal in length.

Figure 4:
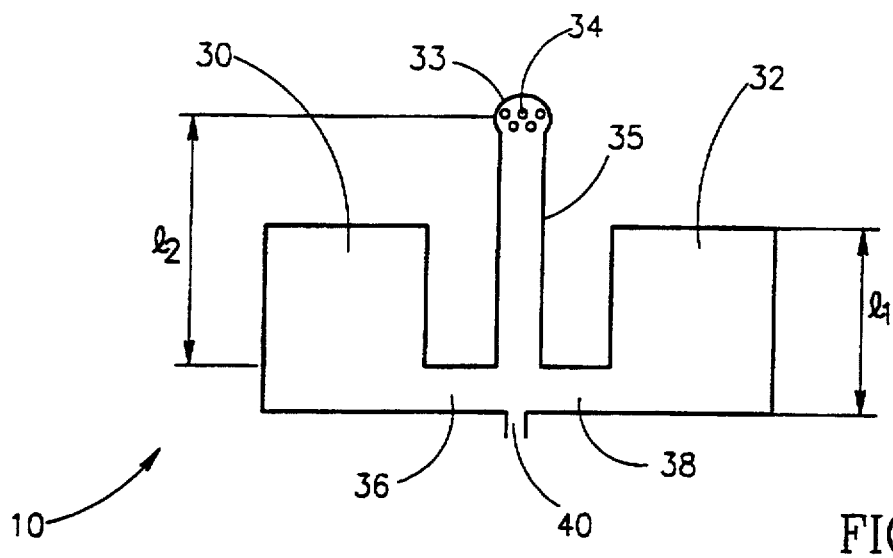
FIG. 4 is an upper view of the resonator of the present invention having a short circuit line longer than the open circuit lines.

An upper view of the resonator 10 of the present invention having a short circuit line $l_2$ longer than the open circuit lines $l_1$ is shown in FIG. 4. Similar to the resonator of FIG. 1, this resonator comprises a rectangular stub 35 whose length $l_2$ is greater than its width. One end of the stub, the input portion 40, functions to receive an input signal from a circuit coupled to the resonator. The other end of the stub, the grounded portion 34, is coupled to a ground plane (not shown) by way of a plurality of ground vias or through holes 34. The vias to the ground plane must be of low impedance and inductance. Preferably at least four vias couple the ground portion of the stub with the ground plane. A sufficient number of ground vias must be used so that the vias do not add significant impedance or inductance to stub 35. Two connecting stubs 36, 38 are coupled to the input portion 40 of the stub. Coupled to each connecting stub 36, 38 is a rectangular wing 30, 32, respectively, having a length $l_1$.

Similar to the resonator of FIG. 1, stub 35 functions as a strip line inductor at high frequencies and wings 30, 32 function as one of the two plates forming a capacitor. The second plate of the capacitor is the conductive ground plane which is deposited on the bottom surface of the PCB the circuit is constructed on. The ground plane must be large enough in area to cover at least the area of the wings and the stub on the top surface.

Figure 5:
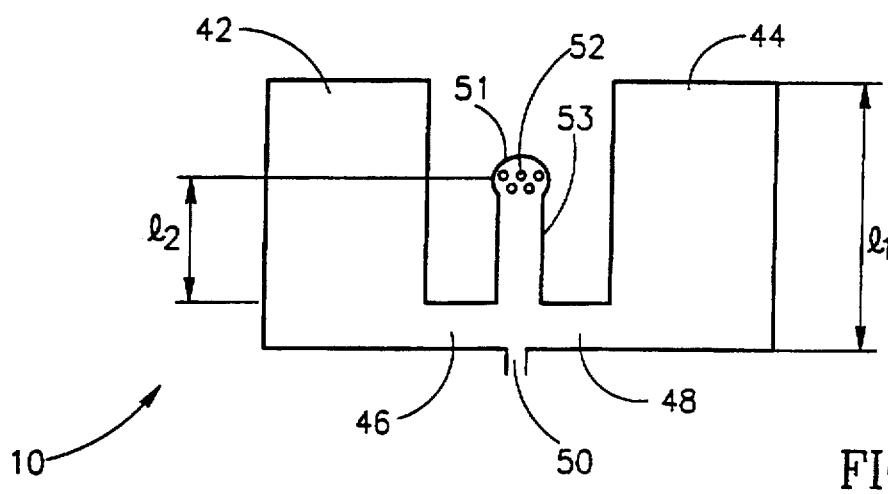
FIG. 5 is an upper view of the resonator of the present invention having a short circuit line shorter than the open circuit lines.

An upper view of the resonator 10 of the present invention having a short circuit line $l_2$ shorter than the open circuit lines $l_1$ is shown in FIG. 5. This resonator comprises a rectangular stub 53 whose length $l_2$ is greater than its width. One end of the stub, the input portion 50, functions to receive an input signal from a circuit coupled to the resonator. The other end of the stub, the grounded portion 51, is coupled to a ground plane (not shown) by way of a plurality of ground vias or through holes 52. The vias to the ground plane must be of low impedance and inductance. Two connecting stubs 46, 48 are coupled to the input portion 50 of the stub. Coupled to each connecting stub 46, 48 is a rectangular wing 42, 44, respectively, having a length $l_1$.

Figure 6:
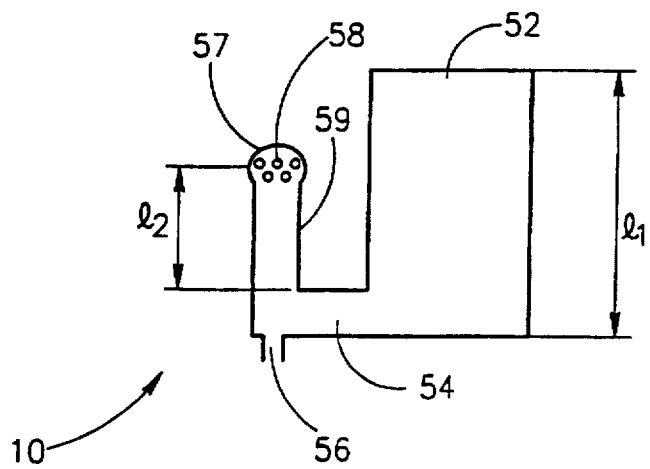
FIG. 6 is an upper view of the resonator of the present invention having a single open rectangular wing.

An upper view of the resonator 10 of the present invention having a single rectangular wing is shown in FIG. 6. This resonator comprises a rectangular stub 59 whose length $l_2$ is greater than its width. One end of the stub, the input portion 56, functions to receive an input signal from a circuit coupled to the resonator. The other end of the stub, the grounded portion 57, is coupled to a ground plane (not shown) by way of a plurality of ground vias or through holes 58. The vias to the ground plane must be of low impedance and inductance. A single connecting stub 54 is coupled to the input portion 56 of the stub. Coupled to connecting stub 54 is a single rectangular wing 52 having a length $l_1$. Three different types of resonator are possible each having a single rectangular wing. The first is with the short circuit line $l_2$ shorter than the open circuit line $l_1$. The second is with the short circuit line $l_2$ longer than the open circuit line $l_1$. The third is with the short circuit line $l_2$ equal to the open circuit line $l_1$. The equations describing the behavior of the single wing resonator are similar to those of the double winged resonator given above with the removal of the factor of 2 which resulted from the summation of the admittances of the two wings in parallel.

The input admittance of the single wing resonator is given by $$Y_{in} = \frac{1}{Z_{CL}} (\alpha l_1 + j \tan \beta l_1) + \frac{1}{Z_{CH}(\alpha l_2 + j \tan \beta l_2)}$$

The equivalent resistance R is given by $$R = \frac{Z_{CL} Z_{CH} \alpha l}{\alpha^2 l^2 Z_{CH} + Z_{CL}}$$

and the equivalent capacitance C given by $$C = \frac{\tan \beta l}{Z_{CL}}$$

and the equivalent inductance L given by $$L = Z_{CH} \tan \beta l$$

At resonance the quality factor Q can be expressed as $$Q = \frac{1}{\omega} \sqrt{\frac{Z_{CH}}{Z_{CL}}} \cdot \frac{1}{\alpha l \frac{Z_{CH}}{Z_{CL}} + \frac{1}{\alpha l}}$$

Figure 7:
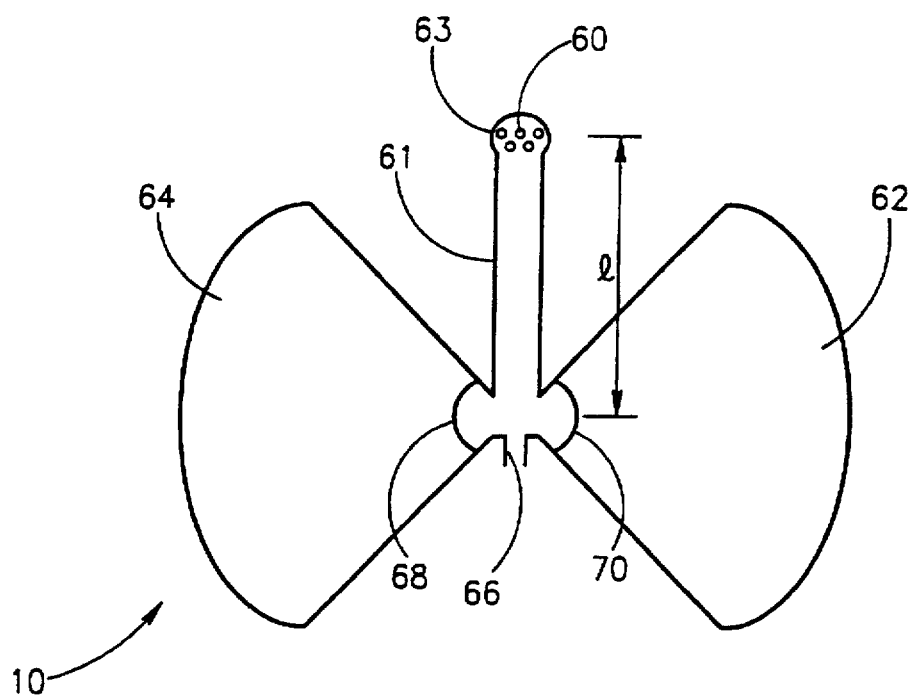
FIG. 7 is an upper view of the resonator of the present invention having radial open circuit stubs.

An upper view of the resonator 10 of the present invention having radial open circuit wings is shown in FIG. 7. This resonator comprises a rectangular stub 61 whose length l is greater than its width. One end of the stub, the input portion 66, functions to receive an input signal from a circuit coupled to the resonator. The other end of the stub, the grounded portion 63, is coupled to a ground plane (not shown) by way of a plurality of ground vias or through holes 60. The vias to the ground plane must be of low impedance and inductance. Coupled to the stub 61 are two radial shaped wings 64, 62 each having a radius Ra and angle A (referenced 68, 70 in FIG. 7. Given the desired performance characteristics one skilled in the art can determine the resonator parameters stub length l, radius Ra and angle A.

The electrical and mechanical specifications of a resonator built in accordance with a preferred embodiment of the present invention and having a form as shown in FIG. 1 is presented below as an illustrative example. The mechanical specifications are as follows:

length $l_1$ of both wings is 9.5 mm width of both wings is 5 mm length of the stub is 9.5 mm width of the stub is 1 mm total width of the resonator is 13.5 mm (including the gaps between the stub and the wings)

PCB is FR4 glass epoxy type with a thickness of 1.6 mm copper is 1 oz./square foot To measure the electrical characteristics, the resonator was connected to a network analyzer through a 1 pF capacitor in series. The resonator constructed having the mechanical specification given above yielded a resonant frequency of approximately 1 GHz and a quality factor Q of approximately 30.

In each of the embodiments disclosed above, the inductance of the stub is determined by its length and width dimensions. Making the stub more narrow (i.e., its length to width ratio increases) increases both the inductance and the ohmic resistance of the stub resulting in a lower quality factor Q for the resonator. Conversely, making the stub less narrow (i.e., its length to width ratio decreases) decreases both the inductance and the ohmic resistance of the stub resulting in a higher quality factor Q for the resonator.

While the invention has been described with respect to a limited number of embodiments, it will be appreciated that many variations, modifications and other applications of the invention may be made.

What is claimed is:

1. An LC-type dielectric strip line resonator, comprising:

a dielectric material having a dielectric constant, an upper surface and a lower surface;

a conductive rectangular strip line stub having a length $l_2$, a width, an input portion and a ground portion, said length of said stub greater than said width of said stub, said input portion for receiving an input signal from an external circuit;

a first connecting strip line stub formed on said upper surface of said dielectric material, said first connecting stub coupled to one side of said input portion of said stub, said first connecting stub having a width approximately that of said stub;

a second connecting strip line stub formed on said upper surface of said dielectric material, said second connecting stub coupled to the opposite side of said input portion of said stub, said second connecting stub having a width approximately that of said stub;

a first conductive rectangular strip line wing formed on said upper surface of said dielectric material, said first rectangular wing having a length $l_1$ and a width, said first rectangular wing coupled to said first connecting stub;

a second conductive rectangular strip line wing formed on said upper surface of said dielectric material, said second rectangular wing having a length $l_1$ and a width, said second rectangular wing coupled to said second connecting stub in symmetrical fashion with said first rectangular wing; and a conductive ground plane formed on said lower surface of said dielectric material, said ground plane having a length and width large enough to cover said rectangular stub, said first connecting stub, said second connecting stub, said first rectangular wing and said second rectangular wing, said ground portion of said rectangular stub comprising at least one through hole electrically coupling said rectangular stub to said ground plane.

2. The strip line resonator according to claim 1, wherein said length $l_1$ of said first and second rectangular wings is equal to said length $l_2$ of said rectangular stub.

3. The strip line resonator according to claim 1, wherein said length $l_1$ of said first and second rectangular wings is smaller than said length $l_2$ of said rectangular stub.

4. The strip line resonator according to claim 1, wherein said length $l_1$ of said first and second rectangular wings is greater than said length $l_2$ of said rectangular stub.

5. An LC-type dielectric strip line resonator, comprising:

a dielectric material having a dielectric constant, an upper surface and a lower surface;

a conductive rectangular strip line stub having a length $l_2$, a width, an input portion and a ground portion, said length of said stub greater than said width of said stub, said input portion for receiving an input signal from an external circuit;

a connecting strip line stub formed on said upper surface of said dielectric material, said connecting stub coupled to one side of said input portion of said stub, said connecting stub having a width approximately that of said stub;

a conductive rectangular strip line wing formed on said upper surface of said dielectric material, said rectangular wind having a length $l_1$ and a width, said rectangular wing coupled to said first connecting stub;

a conductive ground plane formed on said lower surface of said dielectric material, said ground plane having a length and width large enough to cover said rectangular stub, said connecting stub and said rectangular wing, said ground portion of said rectangular stub comprising at least one through hole electrically coupling said rectangular stub to said ground plane.

6. The strip line resonator according to claim 1, wherein said length $l_1$ of said rectangular wing is equal to said length $l_2$ of said rectangular stub.

7. The strip line resonator according to claim 1, wherein said length $l_1$ of said rectangular wing is smaller than said length $l_2$ of said rectangular stub.

8. The strip line resonator according to claim 1, wherein said length $l_1$ of said rectangular wing is greater said length $l_2$ of said rectangular stub.

9. An LC-type dielectric strip line resonator, comprising:

a dielectric material having a dielectric constant, an upper surface and a lower surface;

a conductive rectangular strip line stub having a length l, a width, an input portion and a ground portion, said length of said stub greater than said width of said stub, said input portion for receiving an input signal from an external circuit;

a first conductive radial strip line wing formed on said upper surface of said dielectric material, said first rectangular wing having a length radius Ra and forming an angle A, said first radial wing coupled to one side of said input portion of said rectangular stub;

a second conductive strip line radial wing formed on said upper surface of said dielectric material, said second rectangular wing having a length radius Ra and forming an angle A, said second radial wing coupled to the opposite side of said input portion of said rectangular stub in symmetrical fashion with said first radial wing;

a conductive ground plane formed on said lower surface of said dielectric material, said ground plane having a length and width large enough to cover said rectangular stub, said first radial wing and said second radial wing, said ground portion of said rectangular stub comprising at least one through hole electrically coupling said rectangular stub to said ground plane.

* * * * *

UNITED STATES PATENT AND TRADEMARK OFFICE
CERTIFICATE OF CORRECTION

PATENT NO. : 5,705,966

DATED : January 6, 1998

INVENTOR(S) : Moshe Carmi

It is certified that error appears in the above-indentified patent and that said Letters Patent is hereby corrected as shown below:

Column 5, lines 36-38, change $$" \quad C = \frac{2 \tan \theta 1}{Z_{CL}} \quad "$$

to $$-- \quad C = \frac{2 \tan \theta 1}{\omega Z_{CL}} \quad --.$$

Column 5, lines 41-42, change $$" \quad i \quad L = Z_{CH} \tan \theta 1 \quad "$$

to $$-- \quad L = \frac{Z_{CH} \tan \theta 1}{\omega} \quad --.$$

UNITED STATES PATENT AND TRADEMARK OFFICE
CERTIFICATE OF CORRECTION

PATENT NO. : 5,705,966

DATED : January 6, 1998

INVENTOR(S) : Moshe Carmi

It is certified that error appears in the above-identified patent and that said Letters Patent is hereby corrected as shown below:

Column 7, lines 23-25, change $$" \quad C = \frac{\tan \beta 1}{Z_{CL}} \quad "$$

to $$-- \quad C = \frac{\tan \beta 1}{\omega Z_{CL}} \quad --.$$

UNITED STATES PATENT AND TRADEMARK OFFICE
CERTIFICATE OF CORRECTION

PATENT NO. : 5,705,966
DATED : January 6, 1998
INVENTOR(S) : Moshe Carmi

It is certified that error appears in the above-identified patent and that said Letters Patent is hereby corrected as shown below:

Column 7, lines 28-29, change

" $L = Z_{CH} \tan\beta 1$ "

to $$L = \frac{Z_{CH} \tan\beta 1}{\omega}$$

Signed and Sealed this

Fifteenth Day of September, 1998

Attest:

BRUCE LEHMAN

*Attesting Officer*     *Commissioner of Patents and Trademarks*